US009597873B2

(12) United States Patent
Rivas

(10) Patent No.: US 9,597,873 B2
(45) Date of Patent: Mar. 21, 2017

(54) PRINTHEAD PROTECTIVE COATING

(75) Inventor: Rio Rivas, Bend, OR (US)

(73) Assignee: HEWLETT-PACKARD DEVELOPMENT COMPANY, L.P., Houston, TX (US)

(*) Notice: Subject to any disclaimer, the term of this patent is extended or adjusted under 35 U.S.C. 154(b) by 0 days.

(21) Appl. No.: 14/427,989

(22) PCT Filed: Sep. 12, 2012

(86) PCT No.: PCT/US2012/054829
§ 371 (c)(1),
(2), (4) Date: Apr. 23, 2015

(87) PCT Pub. No.: WO2014/042625
PCT Pub. Date: Mar. 20, 2014

(65) Prior Publication Data
US 2016/0114581 A1  Apr. 28, 2016

(51) Int. Cl.
B41J 2/14 (2006.01)
B41J 2/16 (2006.01)
(Continued)

(52) U.S. Cl.
CPC ........... *B41J 2/1433* (2013.01); *B41J 2/1404* (2013.01); *B41J 2/1412* (2013.01); *B41J 2/162* (2013.01); *B41J 2/1603* (2013.01); *B41J 2/164* (2013.01); *B41J 2/1606* (2013.01); *B41J 2/1628* (2013.01); *B41J 2/1629* (2013.01); *B41J 2/1631* (2013.01); *B41J 2/1642* (2013.01); *B41J 2/1643* (2013.01); *B41J 2/1645* (2013.01); *B41J 2/1646* (2013.01); *C23C 14/0641* (2013.01);
(Continued)

(58) Field of Classification Search
CPC ........ B41J 2/1433; B41J 2/1643; B41J 2/162; B41J 2/164; C23C 14/3457
See application file for complete search history.

(56) References Cited

U.S. PATENT DOCUMENTS 6,942,318 B2  9/2005 Fartash
7,552,533 B2  6/2009 Fartash et al.
(Continued)

FOREIGN PATENT DOCUMENTS

EP  0899110  3/1999
WO  WO-2004056573  7/2004
(Continued)

OTHER PUBLICATIONS

Inkjet Printheads; http://mindmachine.co.uk/book/print_42_inkjet_heads.htm.
(Continued)

*Primary Examiner* — Justin Seo
(74) *Attorney, Agent, or Firm* — HP Inc—Patent Department

(57) ABSTRACT

In one embodiment, a printhead includes a substrate comprising a single fluid slot with sidewall surfaces. The printhead also includes a plurality of fluid chambers in fluid communication with the fluid slot. The printhead includes a membrane disposed between the fluid slot and the fluid chambers. The membrane comprises membrane side surfaces that form fluid feed holes to provide the fluid communication between the fluid slot and the fluid chambers. A protective coating is disposed on each of the surfaces.

20 Claims, 4 Drawing Sheets

(51) Int. Cl.
*C23C 14/06* (2006.01)
*C23C 14/16* (2006.01)
*C23C 14/35* (2006.01)
*C23C 14/34* (2006.01)

(52) U.S. Cl.
CPC .......... *C23C 14/16* (2013.01); *C23C 14/3457* (2013.01); *C23C 14/35* (2013.01); *B41J 2002/14185* (2013.01)

(56) References Cited

U.S. PATENT DOCUMENTS

| | | | |
|---|---|---|---|
| 7,735,976 B2 | 6/2010 | Cha et al. | |
| 7,895,750 B2 | 3/2011 | Park et al. | |
| 8,173,030 B2 | 5/2012 | Lebens et al. | |
| 2006/0066659 A1* | 3/2006 | Giovanola | B41J 2/1404 347/20 |
| 2011/0018938 A1* | 1/2011 | Rivas | B41J 2/1603 347/45 |
| 2013/0065017 A1* | 3/2013 | Sieber | B41J 2/14129 428/137 |

FOREIGN PATENT DOCUMENTS

| | | |
|---|---|---|
| WO | WO-2009134263 | 11/2009 |
| WO | WO-2011053288 | 5/2011 |

OTHER PUBLICATIONS

International Search Report and Written Opinion for PCT/US2012/054829 dated every 25, 2013.

\* cited by examiner

PRINTHEAD PROTECTIVE COATING

BACKGROUND

Fluid ejection devices, such as printheads in inkjet printers, provide drop-on-demand ejection of fluid drops. Inkjet printers produce images by ejecting ink drops through a plurality of nozzles onto a print medium, such as a sheet of paper. The nozzles are typically arranged in one or more arrays, such that properly sequenced ejection of ink drops from the nozzles causes characters or other images to be printed on the print medium as the printhead and the print medium move relative to each other. In a specific example, a thermal inkjet printhead ejects drops from a nozzle by passing electrical current through a heating element to generate heat and vaporize a small portion of the fluid within a firing chamber. In another example, a piezoelectric inkjet printhead uses a piezoelectric material actuator to generate pressure pulses that force ink drops out of a nozzle.

Over time, the ink used in a printhead can cause corrosion that degrades the printhead and reduces the print quality of the printing system. The ink can etch silicon in the printhead, resulting in harmful silicate precipitates in the printhead nozzles and on the printhead firing resistors.

BRIEF DESCRIPTION OF THE DRAWINGS

The present embodiments will now be described, by way of example, with reference to the accompanying drawings, in which.

DETAILED DESCRIPTION

Overview

Figure 1:
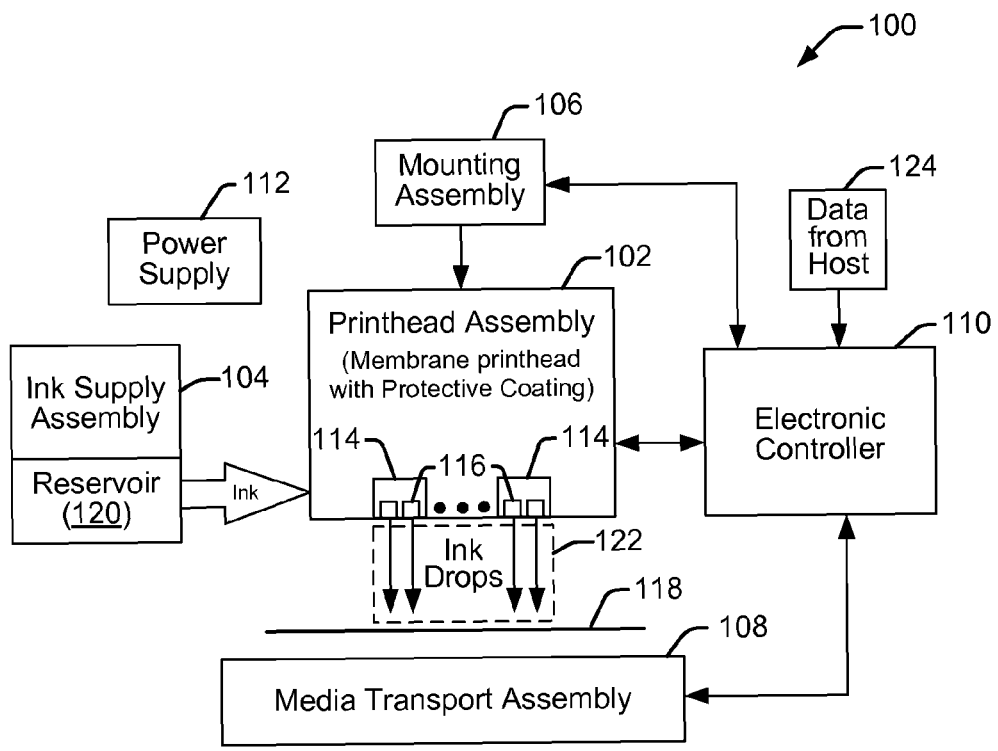
FIG. 1 illustrates an inkjet printing system suitable for incorporating a printhead or fluid ejection device with a protective coating as disclosed herein, according to an embodiment.

As noted above, ink can etch the silicon in printheads and cause harmful silicate precipitates that reduce the print quality in printing systems. The inks used in printheads are typically pigment-based inks or dye-based inks. While dye inks have a wider color gamut than pigment inks, pigment inks are generally preferred because they are more color-fast (i.e., more permanent) than dye inks. However, continuing efforts to enhance the performance of pigment inks (e.g., through chemical manipulation) have increased pH levels within the inks and made them more corrosive. The corrosion results in dissolved silicon that affects the fluid/ink quality by contaminating the fluid/ink. The corrosion also affects the ability to eject the fluid/ink when the dissolved silicon contaminants are deposited on the firing resistors or other ejection elements. In addition, the dissolved silicon contaminants subsequently precipitate out of the fluid/ink and become deposited in narrow passageways and nozzle openings. These deposits can obstruct the flow of ink through the passageways and nozzles, and create nozzle directionality issues that reduce printing performance. Thus, as the performance of pigment inks improves, so too does the aggressiveness with which they corrode printheads and cause reduced print quality in printing systems.

One way to reduce the corrosive effects of ink within printheads is to employ more benign inks. However, this solution defeats the purpose of developing higher performing inks. Another solution, therefore, has been to employ protective coatings within the printhead to reduce or prevent the corrosion caused by the ink.

Embodiments of the present disclosure help to prevent the corrosive effects of ink in printheads through providing self ionized plasma (SIP) physical vapor deposition (PVD) coatings that prevent ink from etching the silicon. Using the described SIP PVD method, protective coatings can be deposited on various surfaces within a printhead having membrane ink-feed holes. For example, protective coatings are deposited on the sidewalls of a main fluid slot, a first or backside of the membrane, and on the narrow sidewalls of the membrane's ink-feed holes that lead between the fluid slot and ink chambers located on a second or topside of the membrane. The protective coatings address the corrosion issue noted above, while expanding the breadth of ink compositions that can be used in a printhead. As a result, the protective coatings reduce the likelihood that the fluid or ink will be contaminated, which helps prevent silicon growth in narrow printhead passageways and around nozzle openings. Consequently, the useful life of a print head can be prolonged and the print quality in printing systems can be better maintained.

In one example embodiment, a method includes creating a self-ionized plasma (SIP) of a coating material. The method further includes establishing a bias on a printhead, where the printhead comprises a substrate with a fluid slot, and a membrane with fluid feed holes covering the fluid slot. The method also includes depositing the coating material on substrate back and sidewall surfaces of the substrate, and on back and side surfaces of the membrane to form a protective coating on the surfaces.

In another example embodiment, a printhead includes a substrate comprising a single fluid slot with sidewall surfaces. The printhead also includes a plurality of fluid chambers in fluid communication with the fluid slot. The printhead includes a membrane disposed between the fluid slot and the fluid chambers. The membrane comprises membrane side surfaces that form fluid feed holes to provide the fluid communication between the fluid slot and the fluid chambers. A protective coating is disposed on each of the surfaces.

In another example embodiment, an inkjet cartridge includes a printhead assembly with a printhead, an ink reservoir attached to the printhead assembly, and a controller to control ejections of ink from the printhead. The printhead includes a substrate with a single fluid slot having sidewall surfaces, a plurality of fluid chambers in fluid communication with the fluid slot, and a membrane disposed between the fluid slot and the fluid chambers. The membrane includes membrane side surfaces that form fluid feed holes to provide the fluid communication between the fluid slot and the fluid chambers, and a protective coating is disposed on each of the surfaces.

Illustrative Embodiments

FIG. 1 illustrates an inkjet printing system 100 suitable for incorporating a printhead or fluid ejection device with a protective coating as disclosed herein, according to an embodiment. In this embodiment, the fluid ejection device/printhead is disclosed as a fluid drop jetting printhead 114 having a membrane with a protective coating. Inkjet printing system 100 includes an inkjet printhead assembly 102, an ink supply assembly 104, a mounting assembly 106, a media transport assembly 108, an electronic controller 110, and at least one power supply 112 that provides power to the various electrical components of inkjet printing system 100. Inkjet printhead assembly 102 includes at least one fluid ejection device 114 or printhead 114, that ejects drops of ink through a plurality of orifices or nozzles 116 toward a print medium 118 so as to print onto print medium 118. Print medium 118 is any type of suitable sheet material, such as paper, card stock, transparencies, Mylar, and the like. Typically, nozzles 116 are arranged in one or more columns or arrays such that properly sequenced ejection of ink from nozzles 116 causes characters, symbols, and/or other graphics or images to be printed onto print medium 118 as inkjet printhead assembly 102 and print medium 118 are moved relative to each other.

Ink supply assembly 104 supplies fluid ink to printhead assembly 102 and includes a reservoir 120 for storing ink. Ink flows from reservoir 120 to inkjet printhead assembly 102. Ink supply assembly 104 and inkjet printhead assembly 102 can form either a one-way ink delivery system or a recirculating ink delivery system. In a one-way ink delivery system, substantially all of the ink supplied to inkjet printhead assembly 102 is consumed during printing. In a recirculating ink delivery system, however, only a portion of the ink supplied to printhead assembly 102 is consumed during printing. Ink not consumed during printing is returned to ink supply assembly 104.

Figure 2:
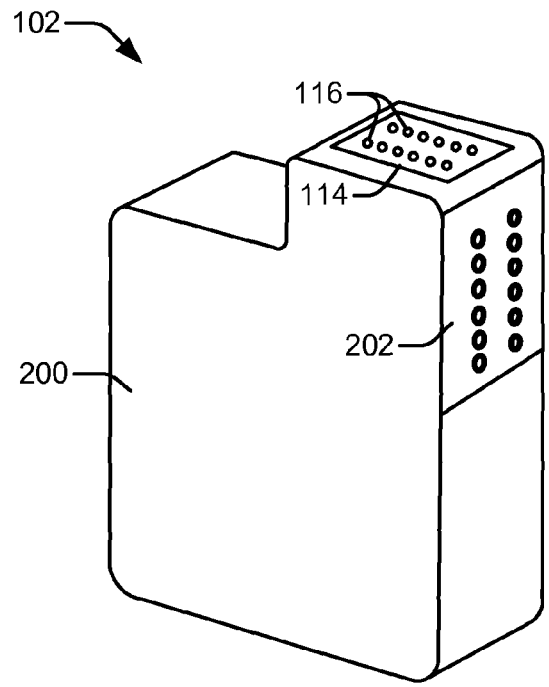
FIG. 2 shows an example of an inkjet printhead assembly implemented as an inkjet cartridge/pen, according to an embodiment.

In one example implementation, inkjet printhead assembly 102 and ink supply assembly 104 are housed together in an inkjet cartridge or pen. FIG. 2 shows an example of an inkjet printhead assembly 102 implemented as an inkjet cartridge/pen 102, according to an embodiment. The inkjet cartridge/pen 102 includes a body 200, a printhead 114 (i.e., fluid ejection device), and electrical contacts 202. Individual ejection elements (e.g., thermal resistors, piezo membranes) within the printhead 114 are energized by electrical signals provided at contacts 202 to eject droplets of fluid ink from selected nozzles 116. The fluid can be any suitable fluid used in a printing process, such as various printable fluids, inks, pre-treatment compositions, fixers, and the like. In some examples, the fluid can be a fluid other than a printing fluid. The inkjet cartridge 102 may contain its own fluid supply within the cartridge body 200, or it may receive fluid from an external supply such as a fluid reservoir 120 connected to the cartridge 102 through a tube, for example. Inkjet cartridges 102 containing their own fluid supplies are generally disposable once the fluid supply is depleted.

Referring again to FIG. 1, mounting assembly 106 positions inkjet printhead assembly 102 relative to media transport assembly 108, and media transport assembly 108 positions print medium 118 relative to inkjet printhead assembly 102. Thus, a print zone 122 is defined adjacent to nozzles 116 in an area between inkjet printhead assembly 102 and print medium 118. In one embodiment, inkjet printhead assembly 102 is a scanning type printhead assembly. In a scanning type printhead assembly, mounting assembly 106 includes a carriage for moving inkjet printhead assembly 102 relative to media transport assembly 108 to scan print medium 118. In another embodiment, inkjet printhead assembly 102 is a non-scanning type printhead assembly. In a non-scanning printhead assembly, mounting assembly 106 fixes inkjet printhead assembly 102 at a prescribed position relative to media transport assembly 108. Thus, media transport assembly 108 positions print medium 118 relative to inkjet printhead assembly 102.

Electronic controller 110 typically includes a processor, firmware, and other printer electronics for communicating with and controlling inkjet printhead assembly 102, mounting assembly 106, and media transport assembly 108. Electronic controller 110 receives data 124 from a host system, such as a computer, and includes memory for temporarily storing data 124. Typically, data 124 is sent to inkjet printing system 100 along an electronic, infrared, optical, or other information transfer path. Data 124 represents, for example, a document and/or file to be printed. As such, data 124 forms a print job for inkjet printing system 100 and includes one or more print job commands and/or command parameters.

In one example implementation, electronic controller 110 controls inkjet printhead assembly 102 for ejection of ink drops from nozzles 116. Thus, controller 110 defines a pattern of ejected ink drops that form characters, symbols, and/or other graphics or images on print medium 118. The pattern of ejected ink drops is determined by the print job commands and/or command parameters from data 124.

In one implementation, inkjet printhead assembly 102 includes one fluid ejection device/printhead 114. In another implementation, inkjet printhead assembly 102 is a wide-array or multi-head printhead assembly. In one example of a wide-array printhead assembly, the inkjet printhead assembly 102 includes a carrier that carries multiple fluid ejection devices 114, provides electrical communication between the ejection devices 114 and electronic controller 110, and provides fluidic communication between ejection devices 114 and ink supply assembly 104.

In one example implementation, inkjet printing system 100 is a drop-on-demand thermal bubble inkjet printing system where the fluid ejection device 114 is a thermal inkjet (TIJ) fluid ejection device/printhead 114. The TIJ fluid ejection device 114 implements a thermal resistor heating element as an ejection element in an ink chamber to vaporize ink and create bubbles that force ink or other fluid drops out of a nozzle 116. In another example implementation, inkjet printing system 100 is a drop-on-demand piezo inkjet printing system where the fluid ejection device 114 is a piezoelectric inkjet printhead that employs a piezoelectric material actuator to generate pressure pulses to force ink drops out of nozzles 116.

Figure 3:
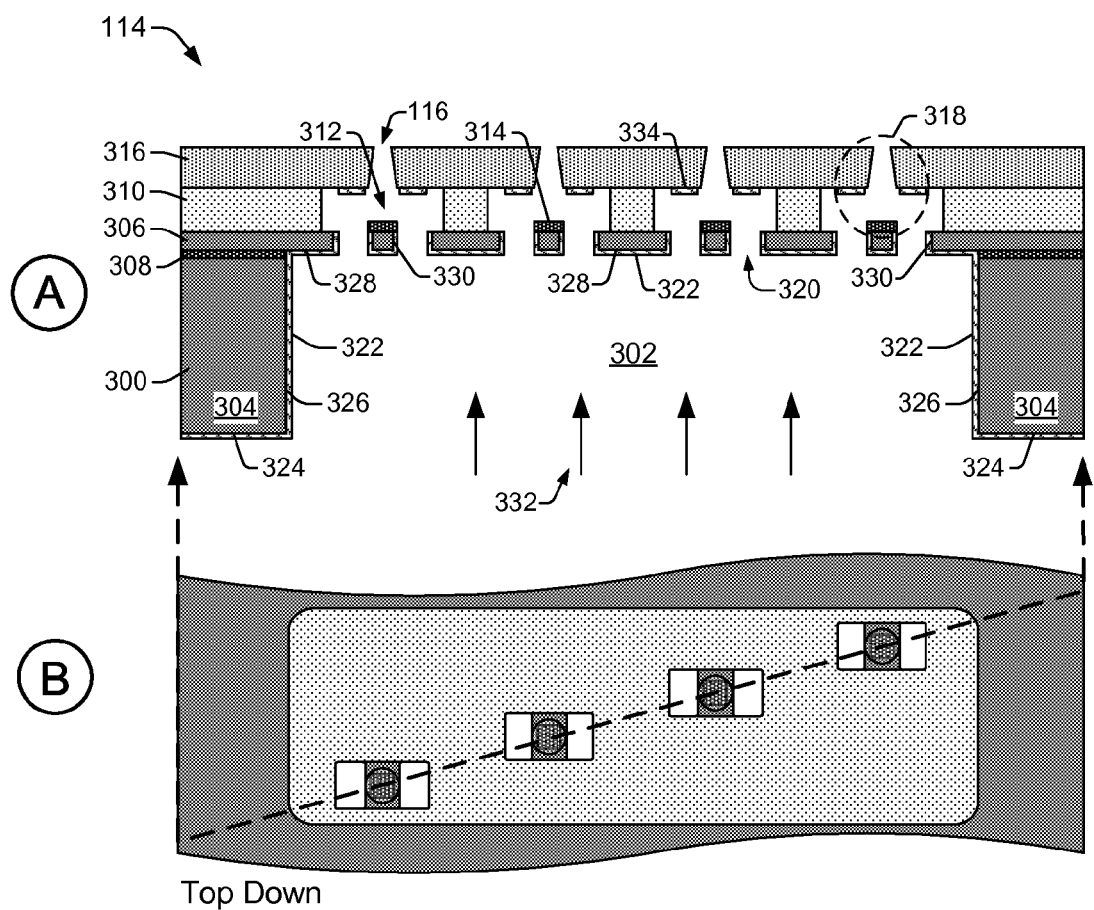
FIG. 3 shows a cross-sectional view and a top down view of a fluid ejection device, according to an embodiment.

FIG. 3 shows a cross-sectional view "A", and a top down view "B", of a fluid ejection device 114 (printhead 114), according to an embodiment of the disclosure. Printhead 114 includes a first substrate 300 comprising a silicon printhead die. The substrate 300 comprises an elongated fluid slot 302, or trench 302, formed therein. The elongated fluid slot 302 extends into the plane of view "A" of FIG. 3, and is in fluid communication with a fluid supply, such as a fluid reservoir 120 (FIG. 1). The fluid slot 302 is a trench formed in the first substrate 300 such that the sidewalls 304 of the fluid slot 302 are formed by the substrate 300. A silicon membrane 306, or second substrate 306, is adhered to the first substrate 300 and spans the fluid slot 302. Membrane 306 forms a top, or cover, over the fluid slot 302. The first substrate 300 and membrane 306 are formed from SOI (silicon on insulator) wafers through standard micro-fabrication processes that are well-known to those skilled in the art (e.g., electroforming, laser ablation, anisotropic etching, sputtering, dry etching, photolithography, casting, molding, stamping, and machining). The adhesion layer 308 between the first substrate 300 and membrane 306 comprises a buried oxide. The buried oxide adhesion layer 308 between substrate 300 and membrane 306 provides a mechanism for achieving accurate etch depths during fabrication while forming features such as the fluid slot 302.

A fluidics or chamber layer 310 is disposed on top of the membrane 306 and includes fluid/ink chambers 312, each comprising a thermal resistor heating element 314. Each resistor 314 acts as an ejection element within a chamber 312 to vaporize ink or other fluids, creating bubbles that force fluid drops out of a corresponding nozzle 116. Resistor 314 can be formed within a thin film stack applied on top of membrane 306, that generally includes a metal layer forming the resistor 314 (e.g., tantalum-aluminum (TaAl), tungsten silicon-nitride (WSiN)), a passivation layer (e.g., silicon carbide (SiC) and silicon nitride (SiN)), and a cavitation layer (e.g., tantalum (Ta)). The top hat layer, also referred to as the orifice plate or nozzle layer 316, is disposed on top of chamber layer 310 and has nozzles 116 formed therein that each correspond with a respective chamber 312 and resistor 314. Thus, an individual fluid drop generator 318 is formed by a corresponding chamber 312, resistor 314, and nozzle 116. In one implementation, the nozzle layer 316 and chamber layer 310 are formed together such that they comprise a single structure. Fluid/ink feed holes 320 extend through the membrane 306 (which forms a top, or cover over the fluid slot 202) and provide fluid communication between the fluid slot 302 and fluid chambers 312.

A protective coating 322 covers various surfaces within printhead 114. As shown in FIG. 3, such surfaces include surfaces of the fluid slot 302 sidewalls 304. Thus, protective coating 322 covers the sidewall back surfaces 324 and the sidewall side surfaces 326. The protective coating 322 also covers surfaces of the membrane 306. Surfaces of membrane 306 covered by protective coating 322 comprise first, or backside surfaces 328 of the membrane 306, and membrane side surfaces 330 that are adjacent the fluid/ink feed holes 320. Consequently, the coating 322 provides a protective blanket on surface areas associated with the fluid slot 302 and membrane 306 that may come in contact with ink or other fluid as it travels through the slot 302 and fluid/ink feed holes 320. As discussed below, the protective coating 322 is formed by creating a self ionized plasma (SIP) of the coating material and depositing the SIP by physical vapor deposition (PVD). Accordingly, the protective coating 322 is deposited in a "line-of-sight" manner from the backside of the printhead 114, in a direction generally indicated by arrows 332. This results in the additional coating of small areas 334 of the underside of nozzle layer 316 opposite the fluid/ink feed holes 320. However, the coating 322 does not extend appreciably into the firing chambers 312, over the resistors 314, or into the nozzles 116, and therefore does not interfere with the ejection of ink from the chambers 312.

The protective coating 322 protects the silicon substrate 300 and silicon membrane 306 from corrosion that can occur when the substrate 300 and membrane 306 come in contact with corrosive fluids or inks used in the printhead 114. Coating 322 comprises one or more layers of one or more materials that are substantially impervious to ink components. In its outermost surface, the coating 322 is substantially inert to fluids directed through the fluid slot 302 and fluid/ink feed holes 320 in membrane 306. Suitable coating materials comprise titanium (Ti), titanium nitride (TiN), tungsten (W), tantalum (Ta), or tantalum nitride (TaN). The protective coating 322 may comprise a homogeneous single layer of a particular material, or multiple layers of a combination of materials. In different implementations, the protective coating 322 can comprise a layer of Ti, a layer of TiN, a layer of W, a layer of Ta, or a layer of TaN. In other implementations, the protective coating 322 can comprise a layer of Ti and a layer of TiN, with the TiN layer as the outermost surface. In other implementations, the protective coating 322 comprises a layer of Ta and a layer of TaN, with the TaN layer as the outermost surface. In other implementations, the protective coating 322 comprises a layer of Ti and a layer of W, with the W layer as the outermost surface. In other implementations native oxides may form on metallic coating surface 322, for example a layer of tantalum oxide may form on a tantalum coating.

Protective coating 322 has a sufficient thickness to ensure the integrity (e.g., continuous with no cracking or breaking) of the protective coating formed on the surfaces of the fluid slot 302 sidewalls 304 and membrane 306. At the same time, coating 322 is thin enough that cracking or delamination of coating 322 resulting from tensile stresses during use is avoided or minimized. In some applications, the total thickness of the protective coating 322 is in the range of about 50 to about 300 angstroms. In some applications, the coating is from about 75 to about 250 angstroms in thickness. In still other applications, the coating is from about 90 to about 210 angstroms in thickness. When the protective coating is very thin (e.g., less than about 300 angstroms), it is transparent in visible light and facilitates downstream die inspection. In other applications, the total thickness of the protective coating is up to 1000 angstroms. In yet other applications, the total thickness of the protective coating is up to 2000 angstroms.

In some implementations, when the protective coating 322 comprises multiple layers, the stress in the protective layer is balanced to zero. For example, the Ti layer has compressive stress and the TiN layer has tensile stress. These two layers in combination result in a zero-stress protective coating 322 that is also resistant to delamination. The stress of a deposited film is readily determined by measuring the curvature of a wafer after a film is deposited, and accounting for the substrate thickness, Young's modulus of the substrate, and the thickness of the deposited film using known methods. Compressive stressed films cause the substrate to bend convex, while tensile stressed films cause the substrate to bend concave.

Figure 4:
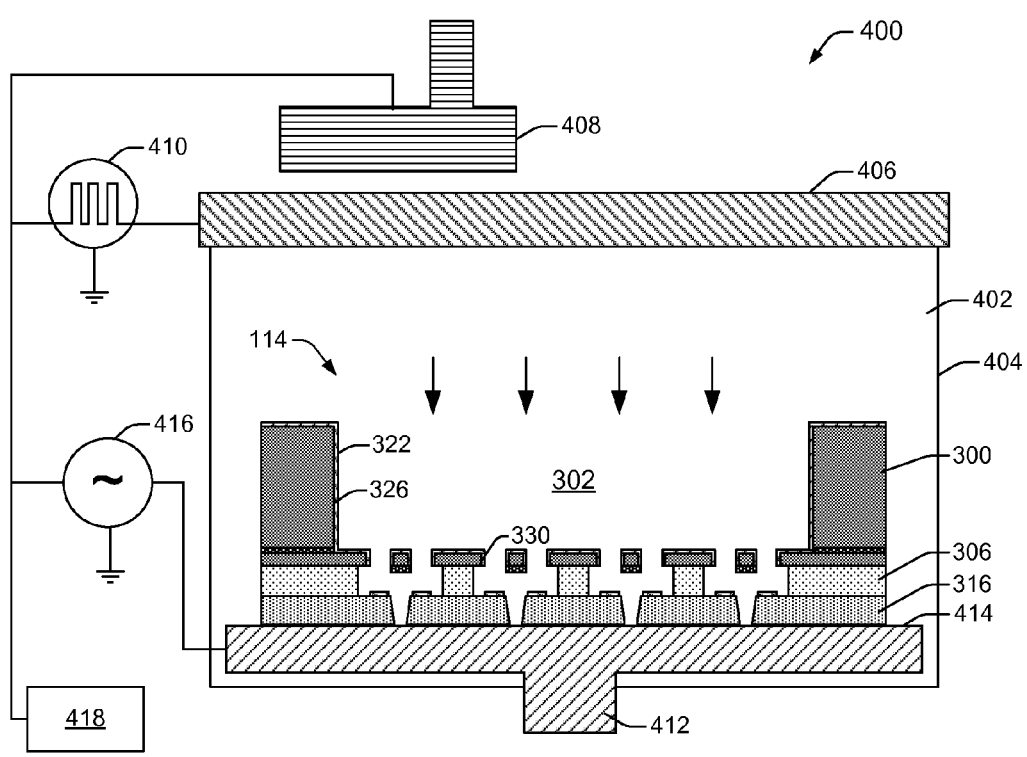
FIG. 4 shows a SIP reactor comprising a sealed Ta SIP PVD vacuum chamber for sputter depositing a protective coating on a printhead, according to an embodiment.

The material for the protective coating 322 can be deposited using self-ionized plasma (SIP) physical vapor deposition (PVD) technology that is known in the art. In one implementation, a fabrication process for forming a protective coating 322 on a printhead 114 with a SIP PVD Ta coating includes fabricating the printhead 114 (including thin films, the fluid/ink feed holes 320 in membrane 306, the fluidics/chamber layer 310, and the fluid slot 302 in substrate 300), using standard micro-fabrication processes such as electroforming, laser ablation, anisotropic etching, sputtering, dry etching, photolithography, casting, molding, stamping, and machining. Then, as shown in FIG. 4, the silicon surfaces of the substrate 300 and membrane 306, as discussed above, can be coated in a Ta SIP PVD chamber by orienting the back side of the printhead substrate 300 such that it faces the Tantalum target. FIG. 4 shows a SIP reactor 400 comprising a sealed Ta SIP PVD vacuum chamber 402 for sputter depositing a protective coating 322 on a printhead 114, according to an embodiment. The vacuum chamber walls 404 are usually made of metal and are electrically grounded. In some cases, an inert gas (e.g., argon) is flowed into the chamber 402 in a controlled manner (not shown in FIG. 4). The reactor 400 also comprises a target 406, which has at least a surface portion composed of the material to be sputter deposited on printhead 114. A DC magnetron 408 is coupled to the target 406 and generates a plasma adjacent to the target 406 for sputter depositing the target material and ionizing the deposited material. The DC magnetron 408 is powered by a DC electrical source 410. The magnetron 408 is scanned about the back of the target 406 and projects its magnetic field into the portion of the reactor adjacent the target 406 to increase the plasma density. The target 406 is typically negatively biased to attract the ions generated in the plasma to deposit the target.

A pedestal electrode 412 has a support surface 414 that supports the printhead 114 and biases the printhead 114 to attract ionized deposition material. The printhead 114 is removably fixed on the support surface 414 of the pedestal electrode 412 on its front side or nozzle layer 316. The pedestal electrode 412 is powered by an AC power source 416. Resistive heaters, refrigerant channels, and a thermal transfer gas cavity may be provided in the pedestal electrode 412 to allow the temperature of the pedestal to be controlled, thereby allowing the printhead 114 to be similarly controlled. The printhead 114 is placed on the pedestal electrode 412 with the open portion of the fluid slot 302 facing toward target 406.

The SIP PVD reactor 400 comprises a controller 418, that in some cases controls the magnetron 408, the DC power source 410, and the AC power source 416. In one implementation, process conditions for the SIP vapor deposition process include a chamber pressure in the range of 0.5 to 2 millitorr, an argon gas flow into the chamber in the range of 10 to 15 SCCM, a pedestal gas flow in the range of 3 to 6 SCCM, a pedestal temperature in the range of −500 C to 1300 C, DC power in the range of 8 to 25 kilowatts, AC bias in the range of 230 to 270 watts, and deposition time in the range of 5 to 90 seconds based on target thickness and process conditions.

The rate at which material is sputter deposited can be controlled by controlling the power of the source biasing the target 408. Because a relatively thin layer deposition is often desired, a low deposition rate is often used to facilitate controlling the thickness of deposition. Consequently, the power level of the target biasing source may be set relatively low to assist in achieving the desired thin layer deposition. For example, at a sufficiently high plasma density adjacent a target 408, a sufficiently high density of target metal ions can develop that ionizes additional metal sputtered from the target 408. As noted above, such a plasma is referred to as a self-ionizing plasma (SIP). The sputtered metal ions may be accelerated across the plasma sheath and toward a biased substrate, thus increasing the directionality of the deposited material. In this case, the biased substrate is the printhead 114, including substrate 300 and membrane 306. The increased energetics of the impinging ion and deposited material on non-vertical planes such as the sidewall side surfaces 326 of substrate 300 and the membrane side surfaces 330 of membrane 306 allow material to be re-sputtered on these vertical sidewall surfaces 326 and 330. Coating of vertical sidewalls such as surfaces 326 and 330 is a challenge in conventional physical vapor deposition (PVD) systems, especially in high aspect ratio structures. The present SIP method enables coverage in both deep and narrow areas of the substrate 300 and membrane 306. This is because SIP creates a high degree of ionization of atoms. The bias on the printhead 114 (substrate 300 and membrane 306) allows the created ions to be accelerated towards the printhead 114 substrate 300 and membrane 306 so that a sufficient amount of ions reaches the bottom of high aspect ratio structures. Furthermore, ion bombardment from accelerated ions re-sputters material from the non vertical planes to coat the vertical sidewall surfaces.

The protective coating 322 allows print head assembly 102 to maintain higher levels of quality over prolonged periods of time. Coating 322 inhibits or prevents fluids or inks from corroding the silicon surfaces of the substrate 300 and membrane 306. Thus, coating 322 inhibits contamination of the fluid or ink caused by solvation of the substrate 300 and membrane 306 material (i.e., silicon). Coating 322 also inhibits the deposition, build up or growth of the dissolved material around fluid/ink feed holes 320, nozzles 116, and upon resistors 314. At the same time, coating 322 does not interfere with the fluid ejection from the printhead 114, and facilitates the printing of enhanced fluids or inks that may be more corrosive. Thus, coating 322 provides greater flexibility in the selection of fluid or ink formulations.

Figure 5:
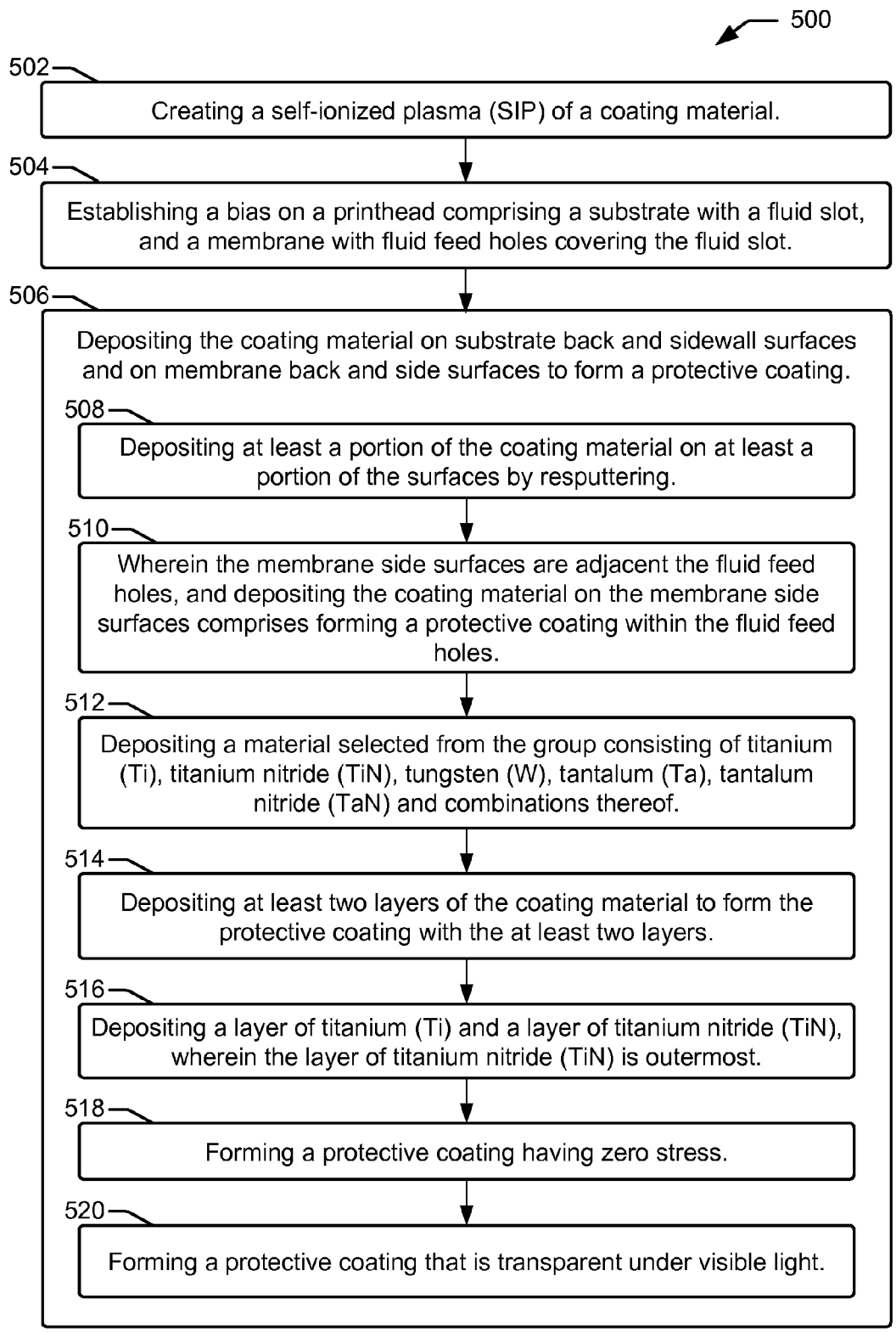
FIG. 5 shows a flowchart of an example method related to providing a printhead protective coating, according to an embodiment.

FIG. 5, shows a flowchart of an example method 500, related to providing a printhead protective coating as generally disclosed herein, according to an embodiment. Method 500 is associated with the embodiments discussed above with regard to FIGS. 1-4, and details of the steps shown in method 500 can be found in the related discussion of such embodiments. Method 500 may include more than one implementation, and different implementations of method 500 may not employ every step presented in the flowchart. Therefore, while steps of method 500 are presented in a particular order in the flowchart, the order of their presentation is not intended to be a limitation as to the order in which the steps may actually be implemented, or as to whether all of the steps may be implemented. For example, one implementation of method 500 might be achieved through the performance of a number of initial steps, without performing one or more subsequent steps, while another implementation of method 500 might be achieved through the performance of all of the steps.

Referring to FIG. 5, method 500 begins at block 502, with creating a self-ionized plasma (SIP) of a coating material. At block 504, a bias is established on a printhead. The printhead comprises a substrate with a fluid slot, and a membrane with fluid feed holes covering the fluid slot. At block 506, the method 500 continues with depositing the coating material on substrate back and sidewall surfaces, and on membrane back and side surfaces to form a protective coating. The depositing can include depositing at least a portion of the coating material on at least a portion of the surfaces by resputtering, as shown at block 508. Where the membrane side surfaces are adjacent the fluid feed holes, the depositing can include depositing the coating material on the membrane side surfaces to form a protective coating within the fluid feed holes, as shown at block 510. As shown at block 512, depositing can include depositing a material selected from the group consisting of titanium (Ti), titanium nitride (TiN), tungsten (W), tantalum (Ta), tantalum nitride (TaN) and combinations thereof. Depositing can also include depositing at least two layers of the coating material to form the protective coating with the at least two layers, as shown at block 514. As shown at block 516, depositing can include depositing a layer of titanium (Ti) and a layer of titanium nitride (TiN), wherein the layer of titanium nitride (TiN) is the outermost layer. In different implementations, depositing the coating material can also include forming a protective coating having zero stress, and forming a protective coating that is transparent under visible light, as shown at blocks 518 and 520, respectively.

What is claimed is:

1. A method, comprising:
creating a self-ionized plasma (SIP) of a coating material;
establishing a bias on a printhead comprising a substrate with a fluid slot, and a membrane with fluid feed holes covering the fluid slot; and
depositing the coating material on substrate back and sidewall surfaces and on membrane back and side surfaces to form a protective coating, wherein at least portions of front surfaces of the membrane that are exposed are not coated with the coating material.

2. A method as in claim 1, wherein depositing the coating material comprises depositing at least a portion of the coating material on at least a portion of the surfaces by resputtering.

3. A method as in claim 1, wherein the membrane side surfaces are adjacent the fluid feed holes, and depositing the coating material on the membrane side surfaces comprises forming a protective coating within the fluid feed holes.

4. A method as in claim 1, wherein depositing the coating material comprises depositing a material selected from the group consisting of titanium (Ti), titanium nitride (TiN), tungsten (W), tantalum (Ta), tantalum nitride (TaN) and combinations thereof.

5. A method as in claim 1 further comprising:
creating a self-ionized plasma (SIP) of a second coating material different than the coating material; and
depositing the second coating material on the first coating material deposited on the substrate back and sidewall surfaces and deposited on the membrane back and side surfaces, the coating material and the second coating material forming the protective coating.

6. A method, comprising:
creating a self-ionized plasma (SIP) of a coating material;
establishing a bias on a printhead comprising a substrate with a fluid slot, and a membrane with fluid feed holes covering the fluid slot; and
depositing the coating material on substrate back and sidewall surfaces and on membrane back and side surfaces to form a protective coating, wherein depositing the coating material comprises depositing at least two layers of the coating material to form the protective coating with the at least two layers and wherein depositing at least two layers of the coating material comprises depositing a layer of titanium (Ti) and a layer of titanium nitride (TiN), wherein the layer of titanium nitride (TiN) is outermost.

7. A method as in claim 5, wherein the protective coating formed by the coating material and the second coating material has zero stress.

8. A method as in claim 1, wherein forming the protective coating comprises forming a protective coating that is transparent under visible light.

9. A printhead, comprising:
a substrate comprising a single fluid slot with sidewall surfaces;
a plurality of fluid chambers in fluid communication with the fluid slot;
a membrane disposed between the fluid slot and the fluid chambers, the membrane comprising membrane side surfaces that form fluid feed holes to provide the fluid communication between the fluid slot and the fluid chambers; and
a protective coating disposed on each of the surfaces.

10. A printhead as in claim 9, further comprising:
substrate back surfaces and membrane back surfaces, wherein the protective coating is disposed on all of the substrate back surfaces and the membrane back surfaces.

11. A printhead as in claim 9, wherein the protective coating is formed by self ionized plasma (SIP) physical vapor deposition (PVD).

12. A printhead as in claim 9, wherein the protective coating comprises multiple layers of different materials and wherein the protective coating has substantially zero stress.

13. A printhead as in claim 9, wherein the protective coating comprises a material selected from the group consisting of titanium (Ti), titanium nitride (TiN), tungsten (W), tantalum (Ta), tantalum nitride (TaN), and combinations thereof.

14. A printhead as in claim 13, wherein the protective coating comprises at least two layers of material, wherein each layer of material is different and is selected from the group consisting of titanium (Ti), titanium nitride (TiN), tungsten (W), tantalum (Ta), and tantalum nitride (TaN).

15. The printhead of claim 9 further comprising a fluid ejection device on the membrane adjacent one of the plurality of fluid chambers, wherein the protective coating does not cover the fluid ejection device on the membrane.

16. The printhead of claim 9 further comprising a fluid ejection device on the membrane, a chamber layer on the membrane forming the plurality of fluid chambers, and a nozzle layer on the chamber layer, the nozzle layer having a nozzle adjacent each one of the plurality of fluid chambers.

17. The printhead of claim 16, wherein the protective coating does not cover portions of the chamber layer adjacent the fluid chambers.

18. The printhead of claim 16, wherein the protective coating does not cover interior surfaces of the nozzles in the nozzle layer.

19. The printhead of claim 9, wherein the protective coating comprises a pairing of a first coating material and a second outermost coating material on the first coating material, the pairing selected from a group of pairings consisting of: (1) the first coating material being tantalum and the second coating material being tantalum nitride; (2) the first coating material being titanium and the second coating material being tungsten; and (3) the first coating material being titanium and the second coating material being titanium nitride.

20. The printhead of claim 9, wherein the protective coating is disposed on each of the surfaces of the substrate and the membrane side surfaces and wherein at least portions of front surfaces of the membrane adjacent the plurality of fluid chambers are not coated with the coating material.

* * * * *